United States Patent
Roucis et al.

(10) Patent No.: US 7,801,699 B1
(45) Date of Patent: Sep. 21, 2010

(54) REGRESSION TEST MODULES FOR DETECTING AND REPORTING CHANGES IN PROCESS DESIGN KITS

(75) Inventors: James M. Roucis, Monument, CO (US); Robert Chizmadia, Woodbine, MD (US); Douglas L. Anneser, Hollis, NH (US); Martin C. Shipley, Fort Collins, CO (US); Thomas E. Mitchell, Fort Collins, CO (US); Martha Johnson, Fort Collins, CO (US); Andrew M. Weilert, Fort Collins, CO (US)

(73) Assignees: Cadence Design Systems, Inc., San Jose, CA (US); Avago Technologies General IP (Singapore) Pte. Ltd., Singapore (SG)

(*) Notice: Subject to any disclaimer, the term of this patent is extended or adjusted under 35 U.S.C. 154(b) by 650 days.

(21) Appl. No.: 11/401,700

(22) Filed: Apr. 10, 2006

(51) Int. Cl.
   *G06F 15/00* (2006.01)
(52) U.S. Cl. .............. 702/182; 716/18; 716/1; 716/4; 714/15; 714/38; 324/763; 324/765; 438/18; 703/13; 703/14; 703/19
(58) Field of Classification Search ............ 702/182; 716/18, 1, 2, 4, 5; 703/13, 14, 19; 714/15, 714/30, 33, 37, 38, 45, E11.208; 324/763, 324/765; 438/18
   See application file for complete search history.

(56) References Cited

U.S. PATENT DOCUMENTS

| | | | | |
|---|---|---|---|---|
| 5,586,046 | A * | 12/1996 | Feldbaumer et al. | 716/18 |
| 5,673,387 | A * | 9/1997 | Chen et al. | 714/38 |
| 5,995,736 | A * | 11/1999 | Aleksic et al. | 716/18 |
| 6,061,643 | A * | 5/2000 | Walker et al. | 702/123 |
| 6,185,726 | B1 * | 2/2001 | Chou | 716/18 |
| 6,530,054 | B2 * | 3/2003 | Hollander | 714/739 |
| 6,587,997 | B1 * | 7/2003 | Chen et al. | 716/4 |
| 7,020,852 | B2 * | 3/2006 | Oeltjen et al. | 716/1 |
| 7,178,063 | B1 * | 2/2007 | Smith | 714/38 |
| 7,239,163 | B1 * | 7/2007 | Ralston-Good et al. | 324/763 |
| 7,240,303 | B1 * | 7/2007 | Schubert et al. | 716/4 |
| 2005/0102572 | A1 * | 5/2005 | Oberlaender | 714/29 |
| 2005/0102596 | A1 * | 5/2005 | Hekmatpour | 714/741 |
| 2005/0283664 | A1 * | 12/2005 | Coulter et al. | 714/15 |

OTHER PUBLICATIONS

M.C. Scott, M.O. Peralta and J.D. Carothers, "System and Framework for QA of Process Design Kits", IEEE Computer Society, pp. 1-6, 2003.

* cited by examiner

*Primary Examiner*—Carol S Tsai
(74) *Attorney, Agent, or Firm*—McDermott Will & Emery LLP

(57) ABSTRACT

A method for detecting and reporting changes in functional features of a simulation model caused by a software revision is disclosed. In one aspect, the method is independent of simulation model architecture. One performs regression testing with a plurality of feature-specific modules. The feature-specific modules are configured to generate a first set of information with the simulation model and compare the first set of information to a second set of corresponding information from the simulation model. In the above-described testing, the first set of information postdates the software revision and the second set of information predates the software revision.

21 Claims, 3 Drawing Sheets

REGRESSION TEST MODULES FOR DETECTING AND REPORTING CHANGES IN PROCESS DESIGN KITS

STATEMENT AS TO A JOINT RESEARCH AGREEMENT UNDER 35 U.S.C. §103(c)

The present invention was made on behalf of Cadence Design Systems, Inc. and Avago Technologies General IP Pte. Ltd. (as successor-in-interest to Agilent Technologies, Inc.) pursuant to, and within the scope of, a joint research agreement that was in effect on or before the date the claimed invention was made.

FIELD OF THE INVENTION

The present invention relates, in general, to computer-assisted semiconductor design. More particularly, the invention relates to efficient methods for verifying ongoing revisions to process design kits and design software.

BACKGROUND OF THE INVENTION

In the electronics industry, multi-billion dollar capital costs for semiconductor fabrication facilities have been a motive force for a trend towards bifurcating design and fabrication. Some organizations assume innovation risk and focus on designing devices while shifting capital risk in outlays for fabrication facilities to other organizations. In a complementary manner, fabrication foundries assume capital risk for a multi-billion dollar facility while shifting innovation risk to design organizations.

While economic factors lead to a bifurcation of design and fabrication, the technical problem remains coupled. That is, the structure of a realized semiconductor device reflects the fabrication processes used to make the device. Accordingly, to ensure accurate realization of a design, best practices are implemented which include information about the fabrication foundry processes in design software tools. The foundry process information is typically in the form of complex models, which are referred to as Process Design Kits ("PDKs").

From time to time, users revise PDKs because accuracy of the information in a PDK is critical. One piece of incorrect data can potentially cause problems that range from loss of time due to rework to catastrophic failure of fabricated devices. A problem thus arises in how to detect changes due to a PDK revision. Some changes are desired and clear on their faces, however, other changes may be latent, unforeseen or undesired. As a result, continuous and intense efforts are needed to support a PDK infrastructure. Demand for such efforts is affected by factors, such as, the number and extent of PDKs supported by an organization, changes to underlying design software capabilities, changes to fabrication process rules, and requests for additional capabilities from designers.

Heretofore, related art approached the problem of detecting changes due to a PDK revision with reliance on visual inspection of results or brute force techniques, such as, the UNIX diff routine which compares files. Visual inspection is intelligent because it is human-based, but is time consuming and prone to error because humans are not automatons. On the other hand, brute force techniques can be fully automated, yet are not intelligent in that they produce copious irrelevant output (date/time stamps, machine names, insignificant textual or format changes, etc.), which may camouflage pertinent changes.

Hence, it would be desirable to provide an automated and intelligent method to, amongst other things, detect and report changes in a PDK in order to verify revisions prior to re-release and use by designers.

SUMMARY OF THE INVENTION

A method for detecting and reporting changes in functional features of a simulation model caused by a software revision is disclosed. In one aspect, the method is independent of simulation model architecture. One performs regression testing with a plurality of feature-specific modules. The feature-specific modules are configured to generate a first set of information with the simulation model and compare the first set of information to a second set of corresponding information from the simulation model. In the above-described testing, the first set of information postdates the software revision and the second set of information predates the software revision.

Reference to the remaining portions of the specification, including the drawings and claims, will realize other features and advantages of the present invention. Further features and advantages of the present invention, as well as the structure and operation of various embodiments of the present invention, are described in detail below with respect to accompanying drawings, like reference numbers indicate identical or functionally similar elements.

BRIEF DESCRIPTION OF THE DRAWINGS

Aspects, advantages and novel features of the present invention will become apparent from the following description of the invention presented in conjunction with the accompanying drawings.

DETAILED DESCRIPTION OF THE INVENTION

A broad principal of preferred embodiments of the invention is to solve the above-described PDK maintenance problem by employing highly automated and intelligent "regression testing." Generally, regression testing is software maintenance testing with an objective of revealing latent and undesired effects of a revision. For example, when a software flaw, or bug, is fixed by revising the software, functionality that previously worked as desired may stop working or no longer work in the same way that was previously planned. Moreover, the software revision itself may not be robust and may fail after a subsequent revision, in which case the prior fault re-emerges. Accordingly, embodiments of this invention preferably perform an automated test or suite of tests comparing software behavior after a revision to behavior at a time or times before the revision. Typically, though not necessarily, such testing is ongoing over time. In most preferred embodiments, utilities filter out selected results of regression testing which are not deemed important. This advantageously adds an aspect of intelligence to the automatic regression testing.

While described above with respect to PDKs and electronics design, a skilled person will recognize that similar problems arise in the context of software generally, and especially in the context of software that, amongst other things, simulates reality by embodying representations of physical or chemical laws or principals. Alternative realities may also be an aspect of a simulation, for example in the context of game software. Many variations are possible. Accordingly, embodiments of the invention may have wide applicability beyond the teaching example of PDKs and electronics design.

Figure 1:
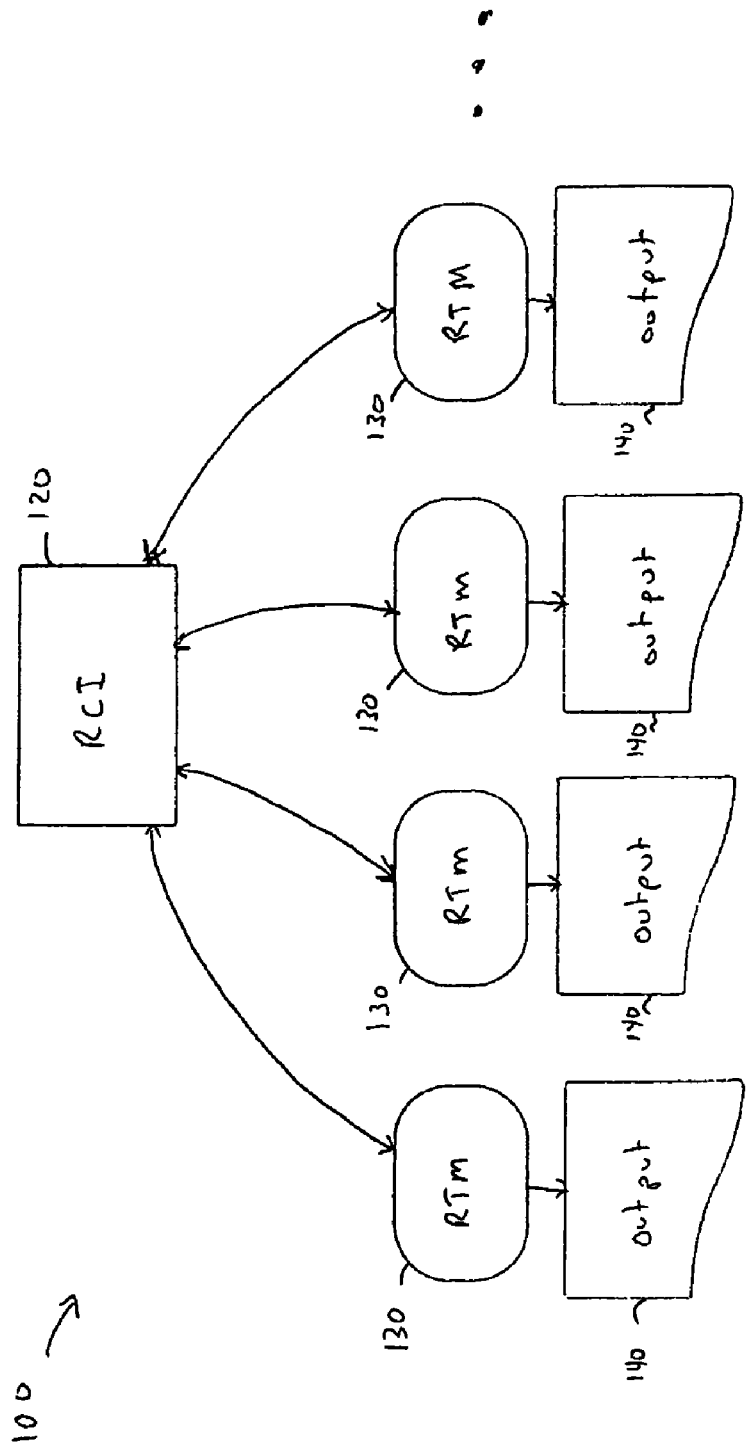
FIG. 1 is a schematic diagram that depicts a portion of a regression test system in accord with an embodiment of the present invention.

FIG. 1 is a diagram that depicts a portion of a regression test system in accord with an embodiment of the present invention. FIG. 1, like all of the figures, is schematic in nature with many details omitted for the sake of clarity. The embodiment illustrated by FIG. 1 includes regression test system ("RTS") 100, regression control interface ("RCI") 120, and a plurality of regression test modules ("RTMs") 130 and RTM outputs 140.

Functionally, RTS 100 performs an automated test or suite of tests comparing software behavior after a revision to behavior at a time or times before the revision. RCI 120 provides command and control functionality over RTMs 130, which in turn provide regression and comparison functionality. Thus, the RCI 120 orchestrates batch execution of regression tests. In an application with a PDK coupled to underlying design software, for example, the RTS 100 may function: (i) to confirm that desired changes have been made to the PDK with no unwanted side-effects; (ii) to verify that seemingly unrelated PDK changes have not adversely affected any feature; or (iii) to detect changes due to revisions in the design software with a fixed PDK by using a fixed PDK to generate reference data, making revisions to the design software, then re-running the RTS 100.

The embodiment depicted in FIG. 1 has each RTM 130 coupled to one RCI 120. In different embodiments, however, the coupling may differ. For example, each RTM 130 may have a RCI 120. Further, in different embodiments, the RCI 120 may include a graphical user-interface ("UI") or a command line UI, for example, within a UNIX shell. Based on the disclosure provided herein, it should be understood that many variations are possible in accord with the invention.

As depicted in FIG. 1, RTS 100 is modular. Testing may be performed with a collection of separate RTMs 130, each RTM 130 being specialized to a particular type of test or simulation model feature. In a PDK application, for example, one RTM 130 may be specialized to provide physical rules verification while another RTM 130 is specialized to provide device layout versus schematic verification. Each RTM 130, functioning within its scope of specialization, may function: (i) to confirm that desired changes have been made to the PDK with no unwanted side-effects; (ii) to verify that seemingly unrelated PDK changes have not adversely affected any feature; or (iii) to detect changes due to revisions in the design software with a fixed PDK by using a fixed PDK to generate reference data, making revisions to the design software, then re-running the RTM 130. Thus, the functionality of RTS 100 is built-up from the individual RTMs 130.

A modular architecture, such as described and illustrated with respect to the exemplary embodiment above, has numerous advantages over known techniques. For example, modular architecture enables detecting and reporting changes due to a revision in a simulation model in a manner that is independent of the simulation model's architecture. In each module, for example, feature-specific RTMs 130 in FIG. 1, a module compares a set of information from the simulation model generated prior to the revision to another set of corresponding information from the simulation model generated after the revision. As a collateral advantage, independence from the simulation model's architecture enables a highly automated process flow substantially free from user intervention.

Also, modular architecture enables comprehensive regression testing as well as regression testing on a feature-by-feature basis. Furthermore, modular architecture enables scaling and extending the technique to accommodate new features or capabilities. Moreover, modular architecture enables a consistent user interaction based on the same or similar UI "look and feel."

Known PDK testing systems, on the other hand, implement a series of sequential steps tailored specifically for a particular PDK with its attendant architecture, and require human intervention to determine changes. Accordingly, such known techniques do not reap at least the advantages described above.

Figure 2:
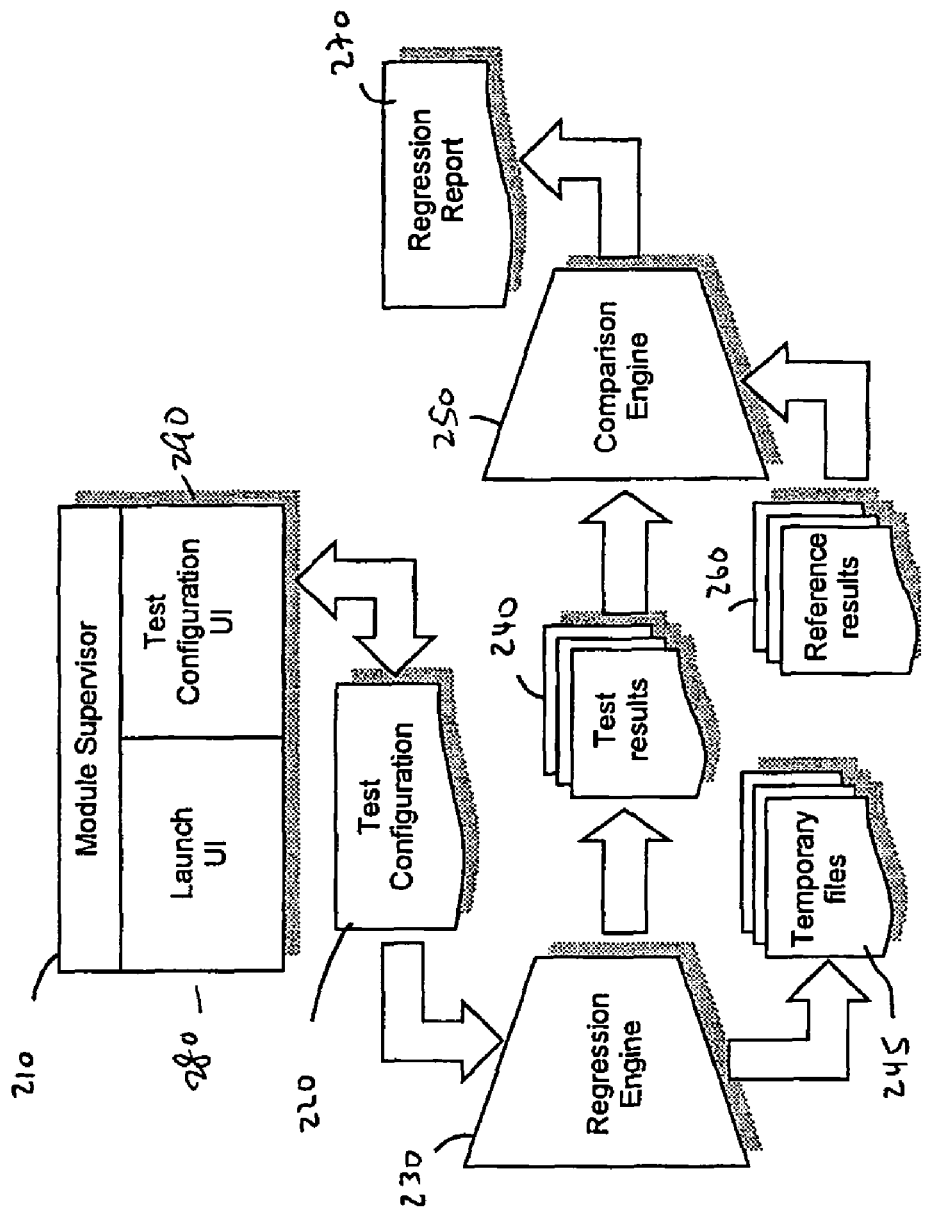
FIG. 2 is a schematic diagram that depicts architectural features of a regression test module in accord with an embodiment of the present invention.

FIG. 2 is a diagram that depicts architectural features of a RTM 130 in accord with an embodiment of the present invention. The embodiment illustrated by FIG. 2 includes module supervisor user interface 210, regression engine 230 and comparison engine 250. In addition, FIG. 2 depicts: test configuration 220, which is input to regression engine 220, test results 240 and temporary files 245, which are output from the regression engine 230. Finally, FIG. 2 depicts reference results 260, which are input to the comparison engine 250, and regression report 270, which is an output of the comparison engine 250.

Regression testing may be interactively configured and launched from module supervisor user interface 210, which may be a tab within another user interface (See RCI 120 in FIG. 1, for example.). For the embodiment in FIG. 2, the module supervisor user interface 210 is a graphical user interface and includes two functional sections: a test invocation or "Launch" user interface 280, which enables a user to select a test configuration and invoke an action or actions upon the test configuration; and a test configuration manager user interface 290, which enables a user to create new test configuration or change existing test configurations. In alternative embodiments, regression testing may be invoked in a batch fashion from, for example, a UNIX shell command line.

Regression engine 230 is a utility that generates test results 240 based on test configuration 220 as input. In different embodiments, the regression may or may not generate temporary files 245. Comparison engine 250 produces regression report 270, which is a summary of differences between test results 240 and reference results 260.

The architecture depicted in FIG. 2 advantageously provides for highly automated flow and enables detecting and reporting changes in a simulation model as follows. One submits a test configuration to a regression engine. Then, one performs a regression test with the regression engine, followed by sending regression test results from the regression engine to a comparison engine, which compares the regression test results to provided reference results and generates a regression report reflective of the regression test.

Figure 3:
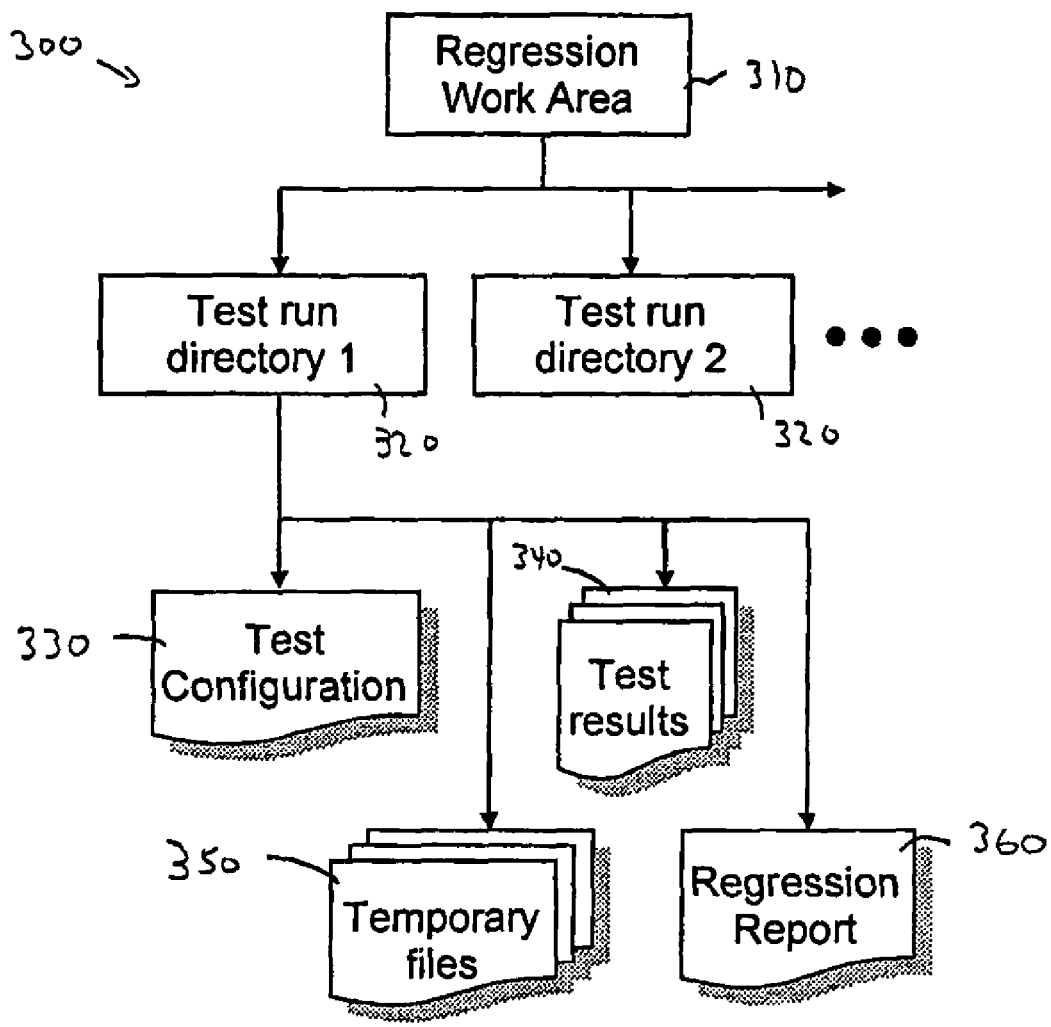
FIG. 3 is a schematic diagram that depicts structural features of a regression test run directory in accord with an embodiment of the present invention.

FIG. 3 is a diagram that depicts structural features of a regression test run directory in accord with an embodiment of the present invention. The regression test run directory 300 is typically a work area for regression tools and a repository for regression test results. In addition, the regression test run directory 300 typically includes a test configuration file, which contains testing parameters. Typically, though not necessarily, regression engine 230 and comparison engine 250 (See FIG. 2.) run from the regression test run directory 300.

The embodiment of regression test run directory 300 illustrated by FIG. 3 includes regression work area 310 which contains one or more test run sub-directories 320. Each test run sub-directory 320, in turn, contains test configuration file 330, test results files 340, temporary files 350 and regression report file 360. In practice, test run sub-directories 320 are preferably grouped by test feature type within a single higher-level directory dedicated to regression testing. Many other variations, however, are in accord with the invention.

Test configuration 220 (See FIG. 2.) typically specifies a reference directory, which contains reference results 260 (See FIG. 2.). In preferred embodiments, the reference directory's structure is substantially the same as a regression test run directory's structure, for example F, as depicted in FIG. 3. These preferred embodiments structure the test directories by test type under a parent directory, which contains only reference data. Many other variations, however, are in accord with the invention.

Preferred embodiments of RTS 100 (See FIG. 1.) include at least one utility to filter out selected results of regression testing which are not deemed important. This advantageously adds an aspect of intelligence to regression testing, thereby avoiding unimportant results such as machine names, date stamps, etc. camouflaging important results. Such utilities may be included in comparison engine 250 (See FIG. 2.). Alternative embodiments may include filtering utilities outside RTM 130. Many variations are in accord with the invention. Thus, in preferred embodiments with filtering utilities, a method for detecting and reporting changes in a simulation model caused by a software revision includes submitting test configurations to a plurality of regression test modules; performing regression testing with the plurality of regression test modules; and producing a regression report which includes less than all of the changes detected by the regression testing.

The previous description of the disclosed embodiments is provided for purposes of illustration and description to enable any person skilled in the art to make or use the present invention. It is not intended to be exhaustive or to limit the invention to the precise form disclosed. Various modifications to these embodiments will be readily apparent to those skilled in the art, and the generic principles defined herein may be applied to other embodiments without departing from the spirit of scope of the invention. Thus, the present invention is not intended to be limited to the embodiments shown herein, but is to be accorded the full scope consistent with the claims, wherein reference to an element in the singular is not intended to mean "one and only one" unless specifically so stated, but rather "one or more". All structural and functional equivalents to the elements of the various embodiments described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. §112, sixth paragraph, unless the element is expressly recited using the phrase "means for" or, in the case of a method claim, the element is recited using the phrase "step for".

We claim:

1. A method for detecting and reporting changes in functional features of a simulation model caused by a software revision, the method being independent of simulation model architecture, the method comprising:
   performing regression testing with a plurality of feature-specific modules, wherein each feature-specific module is configured to perform steps of generating a first set of information with the simulation model; and
   comparing, using a processor, the first set of information to a second set of corresponding information from the simulation model, wherein the first set of information postdates the software revision and the second set of information predates the software revision, wherein the simulation model includes a semiconductor Process Design Kit and device design software.

2. The method of claim 1, wherein each feature-specific module is executed independently of the other feature-specific modules.

3. The method of claim 1, wherein each feature-specific module is executed concurrently with other feature-specific modules.

4. The method of claim 1, wherein the simulation model consists of a semiconductor Process Design Kit.

5. The method of claim 1, wherein the device design software is a sub-element of a semiconductor Process Design Kit.

6. The method of claim 1, further including receiving user instructions from a user-interface.

7. The method of claim 1, wherein the user-interface is a graphical user-interface.

8. The method of claim 6, wherein the user-interface is a command-line interface.

9. A method for detecting and reporting changes in a simulation model that includes a semiconductor Process Design Kit and device design software, the changes caused by a software revision, comprising:
   submitting a test configuration to a regression engine;
   performing a regression test with the regression engine;
   sending regression test results from the regression engine to a comparison engine;
   providing reference results to the comparison engine;
   comparing the regression test results to the reference results; and
   generating a regression report reflective of the regression test,
   wherein the regression test results postdate the software revision and the reference results predate the software revision.

10. The method of claim 9, further including receiving at least one user instruction from a user-interface, wherein at least one user instruction is used to specify the test configuration.

11. The method of claim 10, wherein the user-interface is a graphical user interface.

12. The method of claim 10, wherein the user-interface is a command-line interface.

13. A system for detecting and reporting changes in functional features of a simulation model caused by a software revision, the system being independent of simulation model architecture, the system comprising:
   a plurality of feature-specific modules configured to perform regression testing, wherein each feature-specific module is configured to generate a first set of information with the simulation model; and
   a processor configured to compare the first set of information to a second set of corresponding information from the simulation model,
   wherein the first set of information postdates the software revision and the second set of information predates the software revision, and
   wherein the simulation model includes a semiconductor Process Design Kit and device design software.

14. The system of claim 13, wherein each feature-specific module is configured to be executed independently of the other feature-specific modules.

15. The system of claim 13, wherein each feature-specific module is configured to be executed concurrently with other feature-specific modules.

16. The system of claim 13, wherein the simulation model comprises a semiconductor Process Design Kit.

17. The system of claim 13, wherein the device design software is a sub-element of a semiconductor Process Design Kit.

18. The system of claim 13, further comprising a user-interface configured to receive user instructions.

19. The system of claim 18, wherein the user-interface is a graphical user-interface.

20. The system of claim 18, wherein the user-interface is a command-line interface.

21. A non-transitory computer-readable medium having computer-executable instructions for causing a processor to detect and report changes in functional features of a simulation model caused by a software revision by performing steps comprising:
- performing regression testing with a plurality of feature-specific modules, wherein each feature-specific module is configured to perform steps of generating a first set of information with the simulation model; and
- comparing, using the processor, the first set of information to a second set of corresponding information from the simulation model,
- wherein the first set of information postdates the software revision and the second set of information predates the software revision, and
- wherein the simulation model includes a semiconductor Process Design Kit and device design software.

* * * * *